(12) United States Patent
Lin et al.

(10) Patent No.: US 10,373,906 B2
(45) Date of Patent: Aug. 6, 2019

(54) STRUCTURE AND FORMATION METHOD OF INTERCONNECTION STRUCTURE OF SEMICONDUCTOR DEVICE

(71) Applicant: Taiwan Semiconductor Manufacturing Co., Ltd., Hsinchu (TW)

(72) Inventors: Jyh-Nan Lin, Hsinchu (TW); Tsung-Dar Lee, Hualien (TW); Li Chen, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/492,603

(22) Filed: Apr. 20, 2017

(65) Prior Publication Data
US 2018/0308793 A1    Oct. 25, 2018

(51) Int. Cl.
| | |
|---|---|
| *H01L 23/522* | (2006.01) |
| *H01L 21/768* | (2006.01) |
| *H01L 21/02* | (2006.01) |
| *H01L 23/532* | (2006.01) |

(52) U.S. Cl.
CPC ...... *H01L 23/5226* (2013.01); *H01L 21/0228* (2013.01); *H01L 21/0234* (2013.01); *H01L 21/02178* (2013.01); *H01L 21/02337* (2013.01); *H01L 21/76804* (2013.01); *H01L 21/76832* (2013.01); *H01L 21/76883* (2013.01); *H01L 23/53295* (2013.01)

(58) Field of Classification Search
CPC .......... H01L 23/53295; H01L 21/3141; H01L 21/0228; C23C 16/45525; C23C 16/45529; C23C 16/303
See application file for complete search history.

(56) References Cited

U.S. PATENT DOCUMENTS

| | | | |
|---|---|---|---|
| 9,601,431 B2* | 3/2017 | Ren | H01L 23/53238 |
| 2005/0249876 A1* | 11/2005 | Kawahara | C23C 16/45514 427/255.34 |
| 2008/0179741 A1* | 7/2008 | Streck | C23C 16/303 257/740 |
| 2014/0357090 A1* | 12/2014 | Knaepen | H01L 21/0254 438/761 |
| 2015/0235835 A1* | 8/2015 | Swaminathan | H01L 21/28194 438/778 |

(Continued)

*Primary Examiner* — Latanya N Crawford
(74) *Attorney, Agent, or Firm* — Birch, Stewart, Kolasch & Birch, LLP

(57) ABSTRACT

Structures and formation methods of a semiconductor device structure are provided. A method includes depositing a first layer including Al atoms to cover a first dielectric layer in a first conductive feature. The method also includes depositing a second layer including N atoms over the first layer. The first layer and the second layer form an etch stop layer including aluminum nitride. The etch stop layer includes vacancies and has an atomic percentage of Al to Al and N. The method also includes filling the vacancies in the etch stop layer with additional N atoms to reduce the atomic percentage of Al to Al and N. In addition, the method includes forming a second dielectric layer over the etch stop layer. The method also includes forming a second conductive feature in the second dielectric layer and the etch stop layer to be connected to the first conductive feature.

20 Claims, 10 Drawing Sheets

(56) References Cited

U.S. PATENT DOCUMENTS

2017/0040164 A1\* 2/2017 Wang ................ H01L 21/02178
2017/0092580 A1\* 3/2017 Huang .............. H01L 21/02019
2017/0154806 A1\* 6/2017 Wang ................ H01L 21/02274

\* cited by examiner

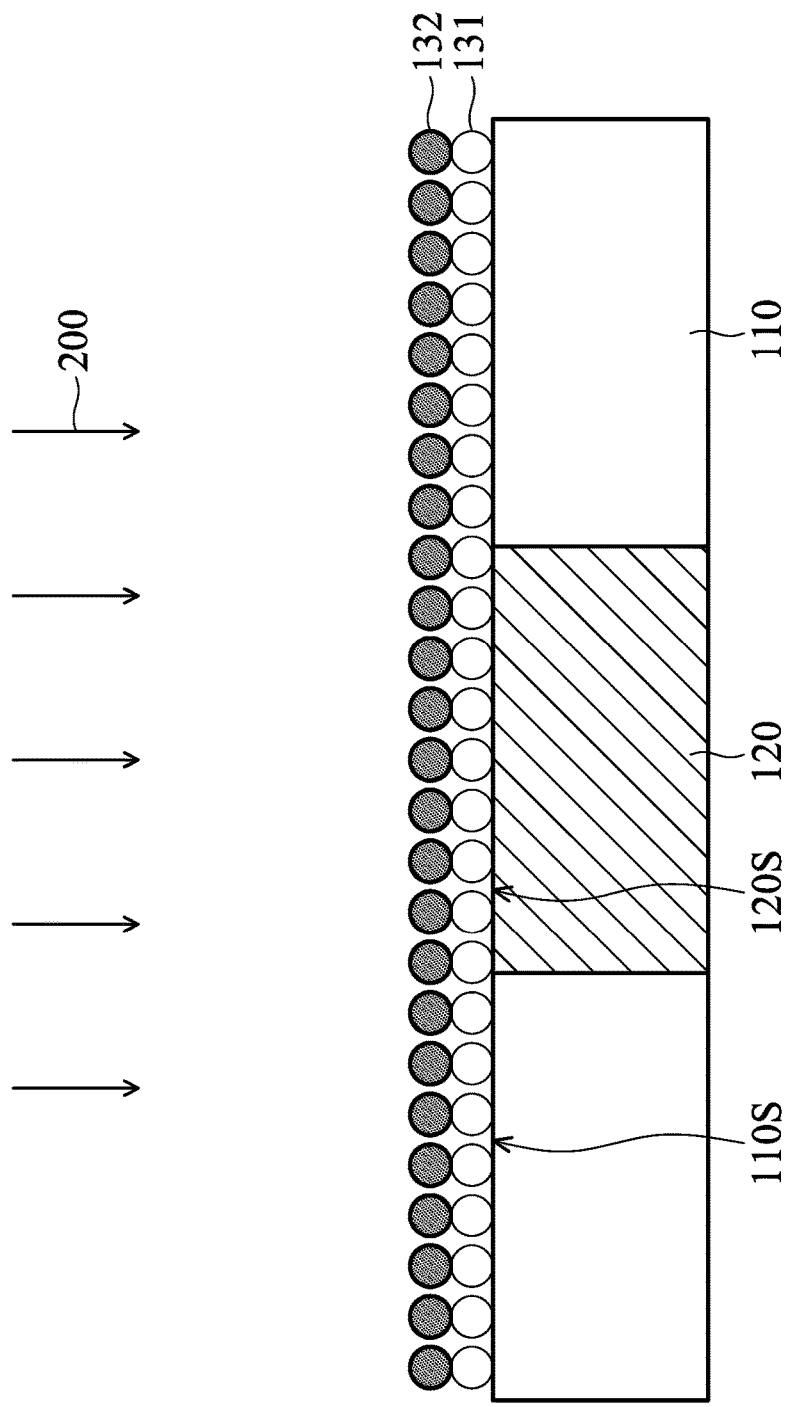

STRUCTURE AND FORMATION METHOD OF INTERCONNECTION STRUCTURE OF SEMICONDUCTOR DEVICE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2E are cross-sectional views of various stages of a process for forming a semiconductor device structure, in accordance with some embodiments.

DETAILED DESCRIPTION

Figure 1A:
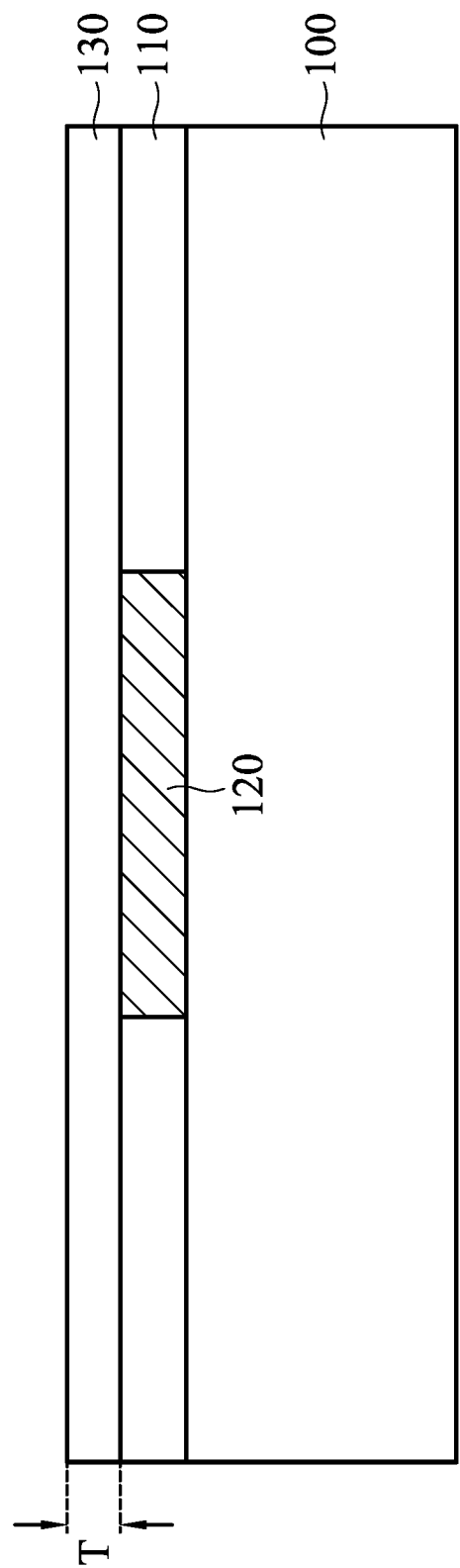
FIGS. 1A-1E are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1E are cross-sectional views of various stages of a process for forming a semiconductor device structure, in accordance with some embodiments. As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the semiconductor substrate 100. The device elements are not shown in figures for the purpose of simplicity and clarity. Examples of the various device elements include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high voltage transistors, high-frequency transistors, p-channel and/or n channel field effect transistors (PFETs/NFETs), etc. Various processes are performed to form the various device elements, such as deposition, etching, implantation, photolithography, annealing, planarization, another applicable process, or a combination thereof.

In some embodiments, isolation features (not shown) are formed in the semiconductor substrate 100. The isolation features are used to define active regions and electrically isolate various device elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

In some embodiments, an interconnection structure (such as the interconnection structure 180 shown in FIG. 1E) is formed over the semiconductor substrate 100. The interconnection structure includes multiple dielectric layers containing an interlayer dielectric (ILD) layer and one or more inter-metal dielectric (IMD) layers. The interconnection structure also includes multiple conductive features formed in the ILD and IMD layers. The conductive features may include conductive lines, conductive vias, and/or conductive contacts.

Various device elements are interconnected through the interconnection structure over the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

As shown in FIG. 1A, a dielectric layer 110 is formed over the semiconductor substrate 100. The dielectric layer 110 may serve as an ILD or IMD layer. The dielectric layer 110 covers device elements are formed in and/or over the semiconductor substrate 100. Although FIG. 1A shows that the dielectric layer 110 is a single layer, embodiments of the disclosure are not limited thereto. In some other embodiments, the dielectric layer 110 is a multi-layer structure including dielectric sub-layers (not shown).

In some embodiments, the dielectric layer 110 is made of or includes silicon oxide, silicon oxynitride, borosilicate glass (BSG), phosphoric silicate glass (PSG), borophosphosilicate glass (BPSG), fluorinated silicate glass (FSG), a low-k dielectric material, porous dielectric material, another suitable material, or a combination thereof. The low-k dielectric material has a smaller dielectric constant than that of silicon dioxide. For example, the low-k dielectric material may have a dielectric constant in a range from about 1.2 to about 3.5. In some embodiments, the dielectric layer 110 is deposited using a chemical vapor deposition (CVD) process, an atomic layer deposition (ALD) process, a spin-on process, a spray coating process, another applicable process, or a combination thereof.

Multiple conductive features are formed in the dielectric layer 110. A conductive feature 120 formed in the dielectric layer 110 is shown in FIG. 1A as an example. The conductive feature 120 is electrically connected to one of the device elements through other conductive features (not shown). For example, the conductive feature 120 may be electrically connected to a gate structure formed on the semiconductor substrate 100 or a doped region formed in the semiconductor substrate 100 through other suitable conductive features.

The conductive feature 120 may include conductive lines, conductive vias, and/or conductive contacts. In some embodiments, the conductive feature 120 is made of copper, aluminum, gold, titanium, cobalt, tungsten, another suitable conductive material, or a combination thereof. Various processes, including deposition, etching, planarization, or the like, may be used to form the conductive feature 120 in the dielectric layer 110.

As shown in FIG. 1A, an etch stop layer 130 is deposited over the dielectric layer 110, in accordance with some embodiments. The conductive feature 120 is covered by the etch stop layer 130. The conductive feature 120 may be in direct contact with the etch stop layer 130. The etch stop layer 130 is used to protect the conductive feature 120 from damage during subsequent processes, which will be described in more detail later.

The etch stop layer 130 has a thickness T. In some embodiments, the thickness T is in a range from about 10 Å to about 50 Å. The thickness T may be equal to or greater than about 10 Å. The thickness T may be equal to or less than about 50 Å. For example, the thickness T may be in a range from about 12 Å to about 35 Å. However, embodiments of the disclosure are not limited thereto.

In some embodiments, the etch stop layer 130 has a crystalline structure. For example, the etch stop layer 130 may have a wurtzite structure. In some embodiments, the etch stop layer 130 is made of or includes aluminum nitride (AlN), another suitable material, or a combination thereof. In some embodiments, the etch stop layer 130 is deposited using an ALD process, a plasma-enhanced ALD (PEALD) process, another applicable process, or a combination thereof. The composition and formation of the etch stop layer 130 will be described in more detail, in accordance with some embodiments of FIGS. 2A-2E.

Figure 1B:
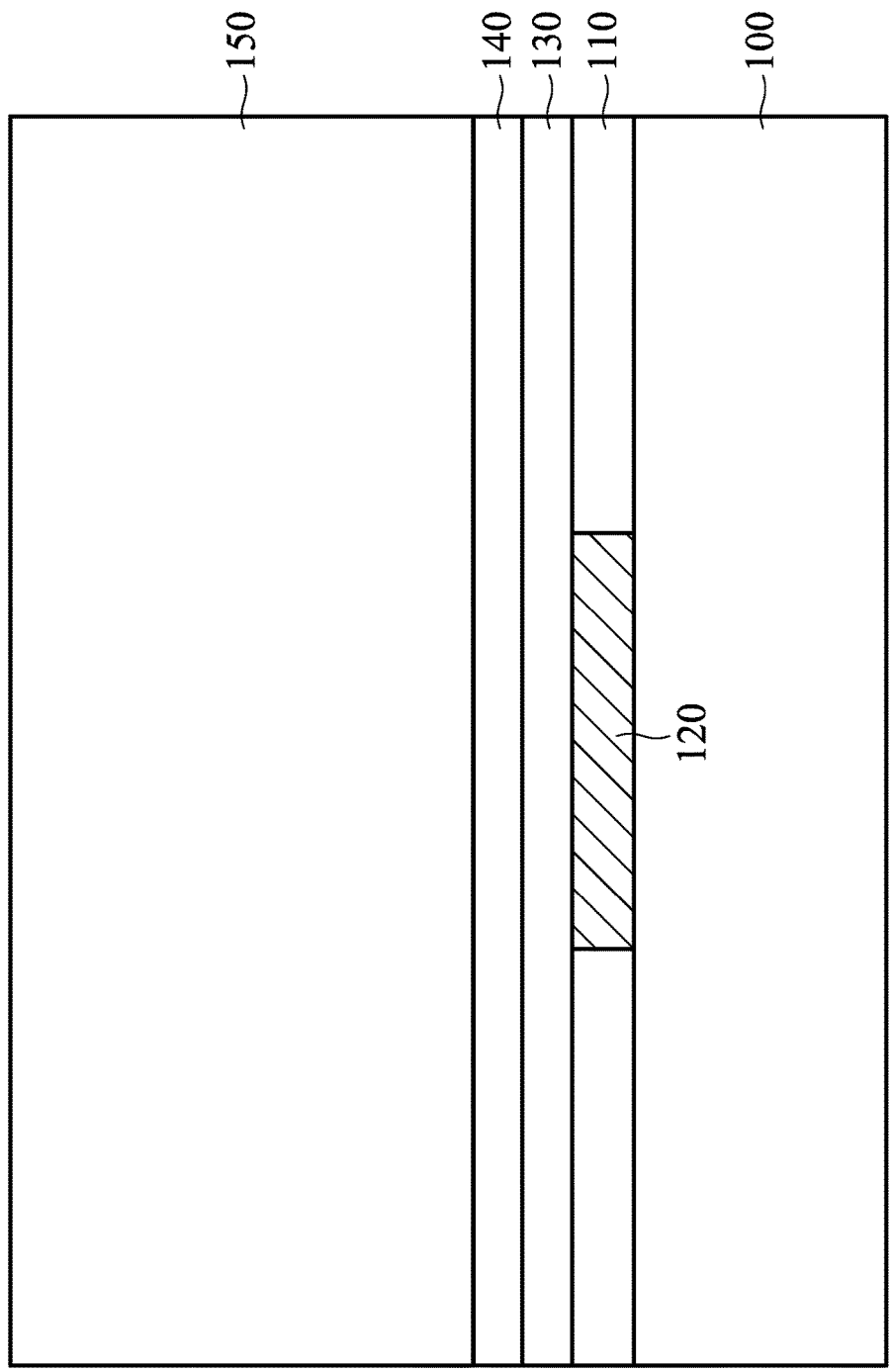

As shown in FIG. 1B, a protection layer 140 is deposited over the etch stop layer 130, in accordance with some embodiments. The protection layer 140 is used to prevent the etch stop layer 130 from oxidation during subsequent processes. Accordingly, current leakage can be reduced or eliminated.

In some embodiments, the protection layer 140 has a thickness in a range from about 30 Å to about 80 Å. In some embodiments, the protection layer 140 is made of or includes aluminum oxide ($Al_2O_3$), nitrogen-doped silicon carbide (SiC:N), oxygen-doped silicon carbide (SiC:O), another suitable dielectric material, or a combination thereof. In some embodiments, the protection layer 140 is an aluminum oxide layer, and has an atomic percentage of aluminum to aluminum and oxygen that is equal to about 40%. In some embodiments, the protection layer 140 is deposited using an ALD process, a CVD process, a spin-on process, a spray coating process, another applicable process, or a combination thereof.

As shown in FIG. 1B, a dielectric layer 150 is deposited over the protection layer 140, in accordance with some embodiments. The dielectric layer 150 may serve as an IMD layer. In some embodiments, the dielectric layer 150 is made of a low-k dielectric material. As the density of semiconductor devices increases and the size of circuit elements becomes smaller, the resistance capacitance (RC) delay time increasingly dominates circuit performance. Using a low-k dielectric material as the dielectric layer 150 is helpful for reducing the RC delay.

In some embodiments, the dielectric layer 150 includes a carbon-containing material. For example, the dielectric layer 150 includes SiOC, SiCOH, SiOCN, or a combination thereof. In some embodiments, the dielectric layer 150 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 150 is deposited using a CVD process, a spin-on process, a spray coating process, another applicable process, or a combination thereof.

In some embodiments, the protection layer 140 is sandwiched between the dielectric layer 150 and the etch stop layer 130. Many variations and/or modifications can be made to embodiments of the disclosure. In some other embodiments, the protection layer 140 is not formed. In these embodiments, the dielectric layer 150 covers and adjoins the etch stop layer 130.

Figure 1C:
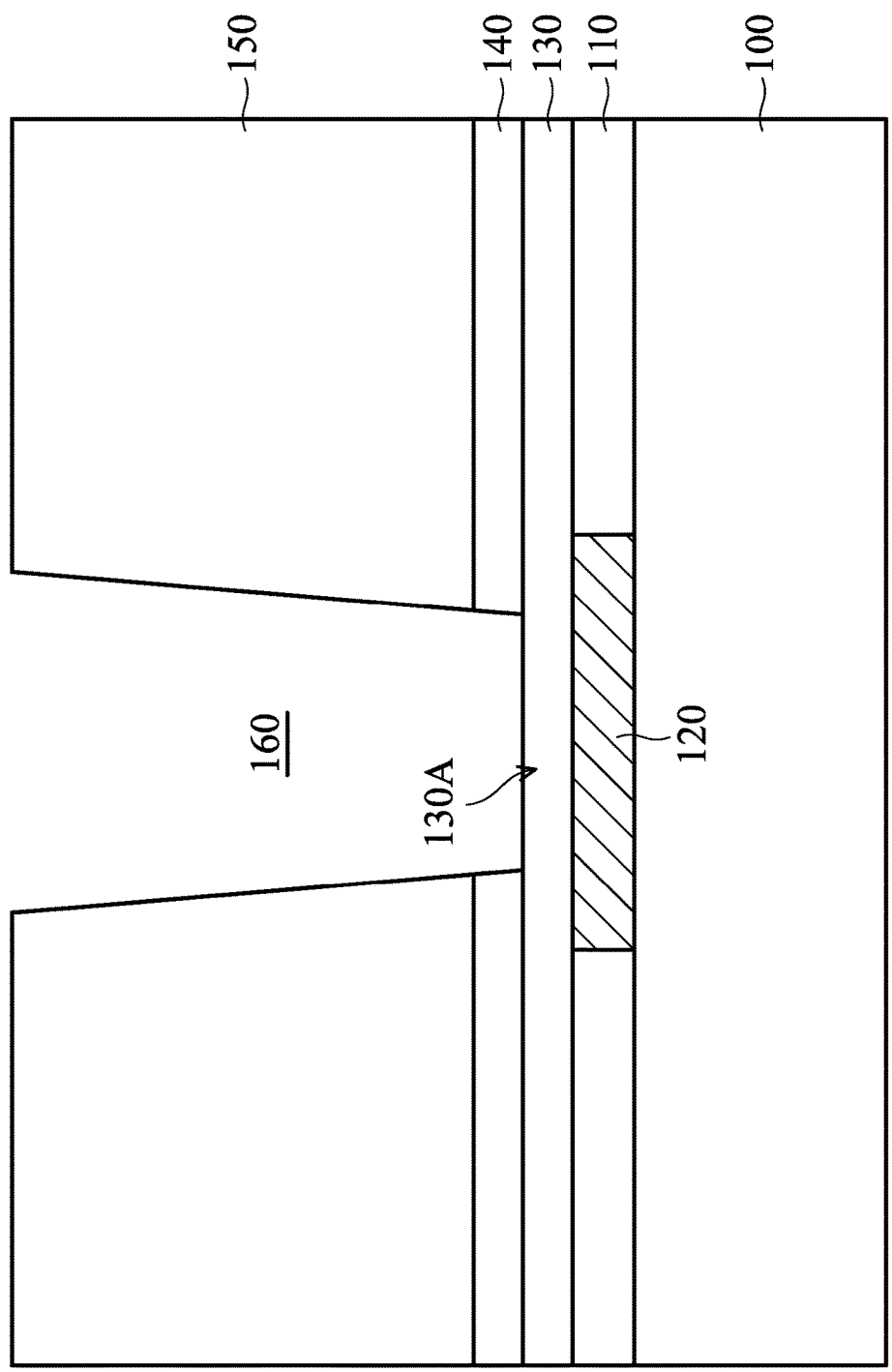

Afterwards, openings are formed in the dielectric layer 150. In some embodiments, the openings include trenches, via holes, or a combination thereof. An opening 160 formed in the dielectric layer 150 is shown in FIG. 1C as an example. The opening 160 penetrates through the dielectric layer 150. In some embodiments, the opening 160 penetrates through the dielectric layer 150 and the protection layer 140.

As a result, the bottom of the opening 160 is lined with a portion 130A of the etch stop layer 130.

In some embodiments, the opening 160 is formed using photolithography and etching processes. The etching process may be a dry etching process, another applicable process, or a combination thereof. In some embodiments, a patterned mask layer (not shown) is formed over the dielectric layer 150 to define the position where the opening 160 will be formed. The etchant used in the etching process for forming the opening 160 has a high etch selectivity of the dielectric layer 150 to the etch stop layer 130. In other words, the dielectric layer 150 is etched much faster than the etch stop layer 130. Accordingly, as mentioned above, the conductive feature 120 is covered and protected by the etch stop layer 130 from damage during the formation of the opening 160. The etchant used in the etching process for forming the opening 160 may have a low etch selectivity of the dielectric layer 150 to the protection layer 140.

Figure 1D:
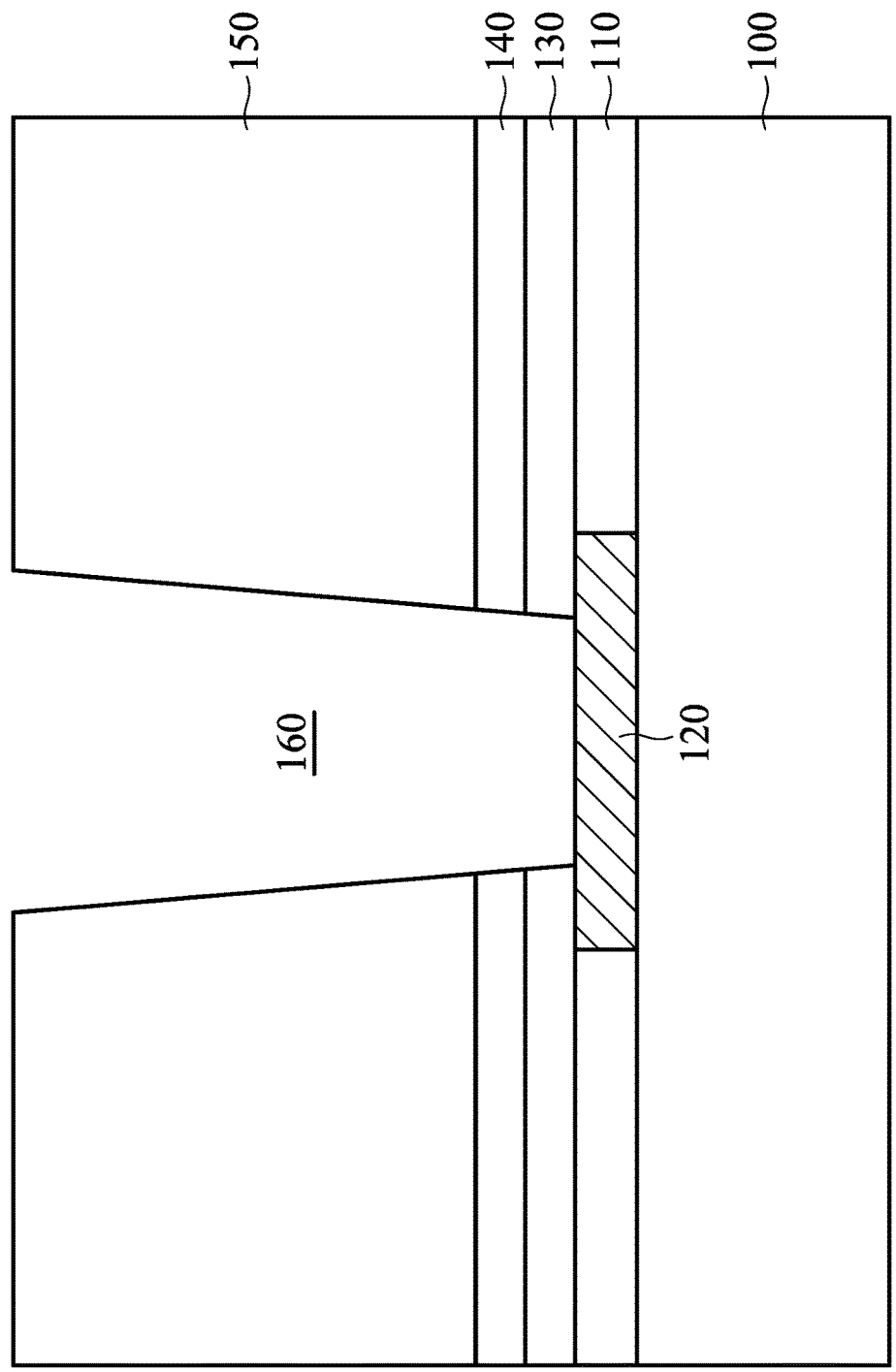

Subsequently, the portion 130A of the etch stop layer 130 lining the bottom of the opening 160 is removed, as shown in FIG. 1D. As a result, the opening 160 extends into the etch stop layer 130 to partially expose the conductive feature 120. In some embodiments, the etch stop layer 130 is partially removed using an etching process. The etching process may be a wet etching process, another applicable process, or a combination thereof. The etchant used in the etching process for exposing the conductive feature 120 has a high etch selectivity of the etch stop layer 130 to the dielectric layer 150. In other words, the etch stop layer 130 is etched much faster than the dielectric layer 150. The etchant used in the etching process for exposing the conductive feature 120 may have a high etch selectivity of the etch stop layer 130 to the protection layer 140.

Afterwards, conductive features are formed in the openings of the dielectric layer 150 to form a part of the interconnection structure 180. The conductive features in the dielectric layer 150 are electrically connected to the conductive features in the dielectric layer 110. The conductive features in the dielectric layer 150 may be a single damascene structure, a dual damascene structure, or a combination thereof.

Figure 1E:
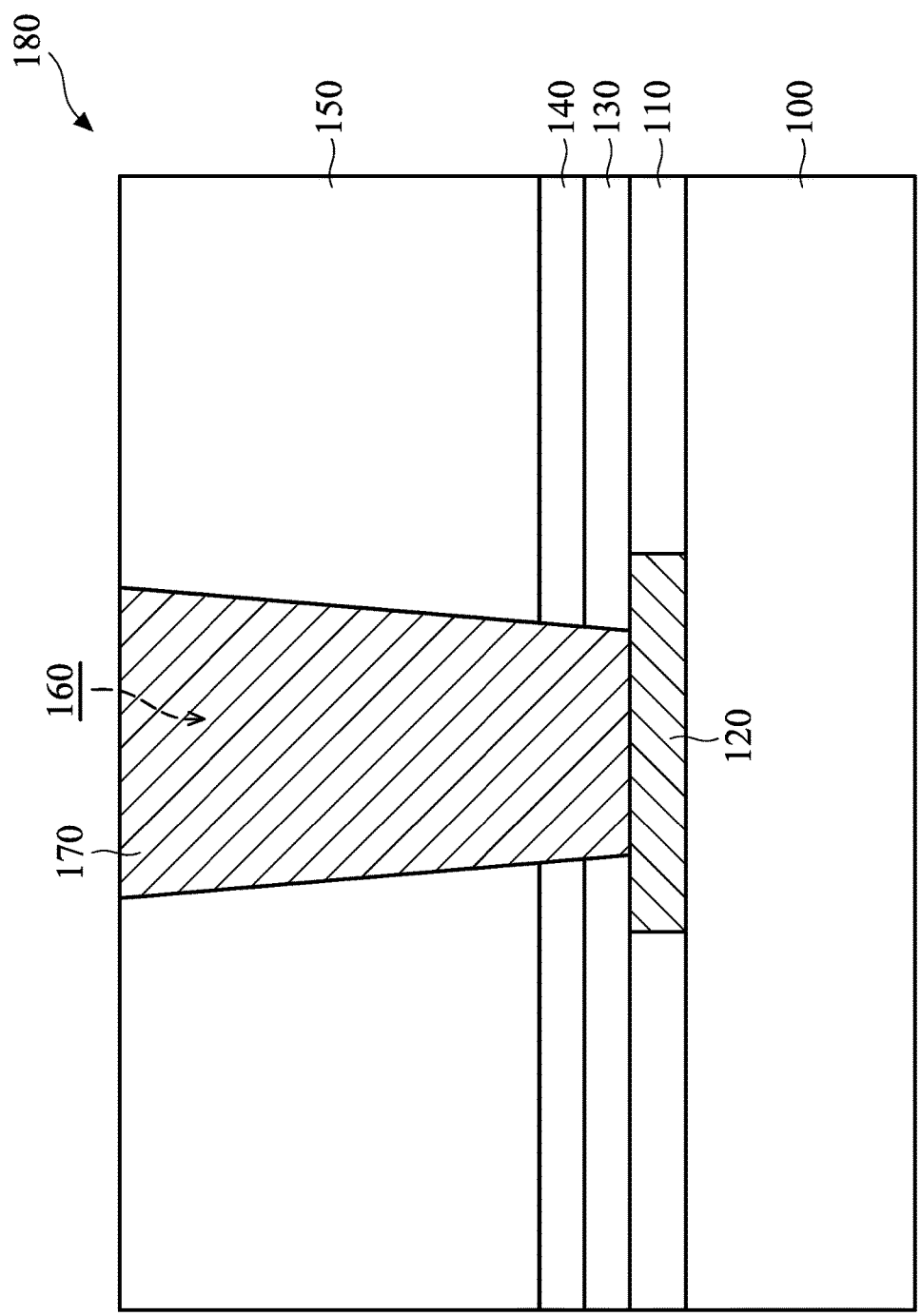

A conductive feature 170 formed in the opening 160 is shown in FIG. 1E as an example. In some embodiments, the conductive feature 170 is a conductive line, a conductive via, or a conductive contact. The conductive feature 170 is physically and electrically connected to the conductive feature 120. In some embodiments, the conductive feature 170 gradually become narrower along the direction from the dielectric layer 150 towards the etch stop layer 130, as shown in FIG. 1E. However, embodiments of the disclosure are not limited thereto. The conductive feature 170 may have another cross-sectional profile. For example, the conductive feature 170 may have substantially vertical sidewalls. The conductive feature 170 may be a single damascene structure or a dual damascene structure.

In some embodiments, the conductive feature 170 is made of or includes copper, aluminum, tungsten, titanium, nickel, gold, platinum, silver, another suitable material, or a combination thereof. The conductive feature 170 may be a single layer or have multiple stacked layers.

In some embodiments, one or more conductive material layers are deposited over the dielectric layer 150 to fill the opening 160. In some embodiments, the one or more conductive material layers are deposited using an electroplating process, a PVD process, a CVD process, an electroless plating process, another applicable process, or a combination thereof.

Afterwards, a planarization process is used to remove the conductive material layers outside of the opening 160. The planarization process may include a chemical mechanical polishing (CMP) process, a dry polishing process, a grinding process, an etching process, another applicable process, or a combination thereof. As a result, the remaining portions of the conductive material layers in the opening 160 form the conductive feature 170.

In some other embodiments, before the conductive material layers are deposited, a barrier layer (not shown) is formed over the dielectric layer 150 and over the sidewalls and the bottom of the opening 160. The barrier layer can protect the dielectric layer 150 from diffusion of a metal material from the conductive feature 170 during subsequent thermal processes or cycles.

For example, the barrier layer is conformally deposited over the dielectric layer 150 and in the opening 160 before the deposition of the conductive feature 170. After the planarization process for forming the conductive feature 170, the barrier layer on the top surface of the dielectric layer 150 is also removed. As a result, the conductive feature 170 is separated from the dielectric layer 150 by the barrier layer.

In some embodiments, the barrier layer is made of tantalum nitride, titanium nitride, tungsten nitride, another suitable material, or a combination thereof. In some embodiments, the barrier layer includes multiple sub-layers including a glue layer (not shown). The glue layer may be used to improve adhesion between the barrier layer and a subsequently formed layer. The glue layer may be made of tantalum, titanium, another suitable material, or a combination thereof. In some embodiments, the barrier layer is deposited using a PVD process, a CVD process, another applicable process, or a combination thereof. Many variations and/or modifications can be made to embodiments of the disclosure. In some other embodiments, the barrier layer is not formed.

Afterwards, one or more dielectric layers and multiple conductive features are formed on the dielectric layer 150 and the conductive feature 170 to continue the formation of the interconnection structure 180 of the semiconductor device structure. In some embodiments, the operations illustrated in FIGS. 1A-1E are repeated one or more times to continue the formation of the interconnection structure 180. For example, another etch stop layer, which may be the same as or similar to the etch stop layer 130, may be deposited to assist the formation of conductive features over the dielectric layer 150.

As advanced technology continues to develop, capacitance becomes more important for circuit performance of a semiconductor device. To reduce the capacitance of the semiconductor device structure, the etch stop layer 130 has been thinned down. As mentioned above, in some embodiments, the thickness T of the etch stop layer 130 is in a range from about 10 Å to about 50 Å. In some cases, the thickness T of the etch stop layer 130 should be substantially equal to or less than about 50 Å. Consequently, the RC delay time is reduced. The power consumption is greatly reduced and the semiconductor device structure can operate faster. However, embodiments of the disclosure are not limited thereto. In some other cases, the thickness T of the etch stop layer 130 may be greater than about 50 Å.

In some cases, the thickness T of the etch stop layer 130 should be substantially equal to or greater than about 10 Å. If the thickness T of the etch stop layer 130 is less than about 10 Å, the etch stop layer 130 may not provide the conductive feature 120 with enough protection from damage during an etching process or other processes. The thin etch stop layer 130 may not be able to prevent metal diffusion from the conductive feature 120, either. However, embodiments of the disclosure are not limited thereto. In some other cases, the thickness T of the etch stop layer 130 may be less than about 10 Å.

In some other cases, when an etch stop layer has been thinned down, metal diffusion through the etch stop layer from an underlying conductive feature may be induced during thermal processes or cycles. For example, metal diffusion may occur if the thickness of an etch stop layer is equal to or less than about 50 Å. However, metal diffusion may be induced when the thickness of an etch stop layer is greater than about 50 Å.

Some embodiments of the disclosure form a semiconductor device structure including a thin etch stop layer without metal diffusion through the thin etch stop layer. FIGS. 2A-2E are cross-sectional views of various stages of a process for forming a semiconductor device structure, in accordance with some embodiments. In some embodiments, FIGS. 2A-2E are enlarged cross-sectional views of various stages of a process for forming the structure shown in FIG. 1A. For example, FIGS. 2A-2E show the formation of the etch stop layer 130. The semiconductor substrate 100 in FIG. 1A is not shown in FIGS. 2A-2E for the purpose of simplicity and clarity. The materials and/or formation methods of the structure shown in FIGS. 2A-2E are the same as or similar to those of the structure shown in FIG. 1A, as illustrated in the aforementioned embodiments, and therefore are not repeated.

In some embodiments, the etch stop layer 130 is deposited using an ALD process which includes multiple deposition cycles. Generally, a deposition cycle is the minimum set of operations required to perform a surface deposition reaction one time. The result of one deposition cycle is production of at least a partial layer. For example, each deposition cycle includes stages shown in FIGS. 2A and 2B. The deposition cycle may be repeated one or more times to grown the etch stop layer 130 of a desired thickness, as shown in FIG. 2C.

More specifically, a deposition process is performed in a reaction chamber (not shown) to introduce or supply a precursor 200 over the dielectric layer 110 and the conductive feature 120, as shown in FIG. 2A. The dielectric layer 110 and the conductive feature 120 are exposed to a pulse of the precursor 200 and react with the precursor 200. Some molecules of the precursor 200 may form a condensed phase atop the surface 110S of the dielectric layer 110 and the surface 120S of the conductive feature 120. The condensed phase includes chemisorbed atoms and/or physisorbed molecules of the precursor 200. As a result, a layer (or monolayer) of atoms 131 is deposited on and bonded to the surface 110S of the dielectric layer 110 and the surface 120S of the conductive feature 120, as shown in FIG. 2A in accordance with some embodiments.

It will be appreciated that the layer of atoms 131 may completely cover the dielectric layer 110 and the conductive feature 120, or may be localized at discrete locations on the dielectric layer 110 and the conductive feature 120. Alternatively, the layer of atoms 131 may have a non-uniform thickness. It depends on, for example, the reactivity of the precursor 200 with different regions on the dielectric layer 110 and the conductive feature 120.

The precursor 200 may be referred to as a source or reactant precursor. The precursor 200 may be a gaseous precursor. In some embodiments, the precursor 200 is an Al-containing precursor, an Al-containing and carbon (C)-containing precursor, or another suitable precursor. Accordingly, the atoms 131 are or include aluminum (Al) atoms.

Examples of the precursor 200 may include trimethyl aluminum (TMA), tri-isobutyl aluminum (TIBA), dimethyl aluminum hydride (DMAH), triethyl aluminum (TEA), another suitable Al-containing material, and combinations thereof. In some embodiments, the precursor 200 is input or flowed into the reaction chamber using a carrier gas. The carrier gas may be an inert gas, such as nitrogen ($N_2$), argon (Ar) or helium (He), or another suitable gas.

In some embodiments, additional atoms 132 are chemically absorbed and bonded to the layer of atoms 131, as shown in FIG. 2A. The atoms 132 may or may not form an additional layer deposited over the dielectric layer 110 and the conductive feature 120. The atoms 132 may be C atoms or other atoms (such as oxygen atoms). The atoms 132 may include C atoms and/or other atoms.

For example, when the precursor 200 includes TMA, the molecules of TMA react with the dielectric layer 110 and the conductive feature 120. Some fractions of TMA, such as aluminum bonded to one or more methyl groups (i.e. Al—$(CH_3)$*), are chemically bonded to the surface 110S of the dielectric layer 110 and the surface 120S of the conductive feature 120. As a result, Al and C atoms of Al—$(CH_3)$* form the layer of atoms 131 and the layer of atoms 132, respectively. In other words, the atoms 132 may be C atoms of methyl groups.

In some embodiments, the operation temperature during the deposition process shown in FIG. 2A is in a range from about 300° C. to about 400° C. In some embodiments, the operation pressure during the deposition process shown in FIG. 2A is in a range from about 2 Torr to about 6 Torr. In some embodiments, the operation time of the deposition process shown in FIG. 2A is in a range from about 2 seconds to about 6 seconds. However, embodiments of the disclosure are not limited to these ranges.

Many variations and/or modifications can be made to embodiments of the disclosure. In some embodiments, one or more additional treatments are performed over the dielectric layer 110 and the conductive feature 120 before the deposition process shown in FIG. 2A. For example, a surface treatment may be performed to clean and remove oxide (such as copper oxide) on the surface 120S of the conductive feature 120. Consequently, it is easier for the precursor 200 to react with the conductive feature 120. Current leakage can also be reduced or eliminated. The reactant used in the surface treatment may contain plasma and/or may include hydrogen. For example, the reactant used in the surface treatment may be hydrogen plasma, ammonia ($NH_3$) plasma, another suitable reactant, or a combination thereof.

After the flow of the precursor 200 is stopped, the reaction chamber is purged. A purge gas is flowed into the reaction chamber to remove excess and unreacted precursor 200 and by-products. The purge gas may be an inert gas, such as $N_2$, or another suitable gas.

Figure 2B:
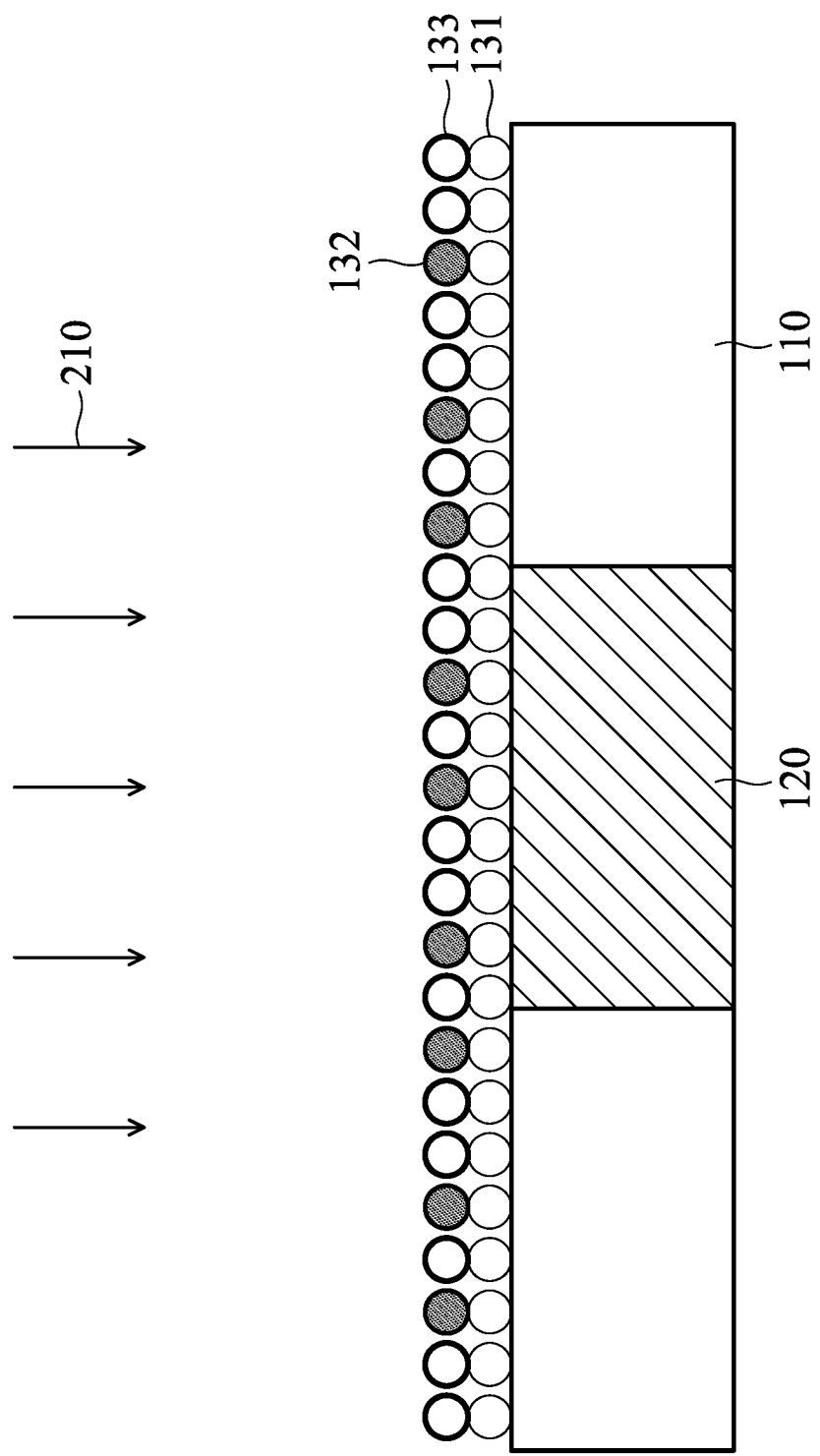
Figure 2C:
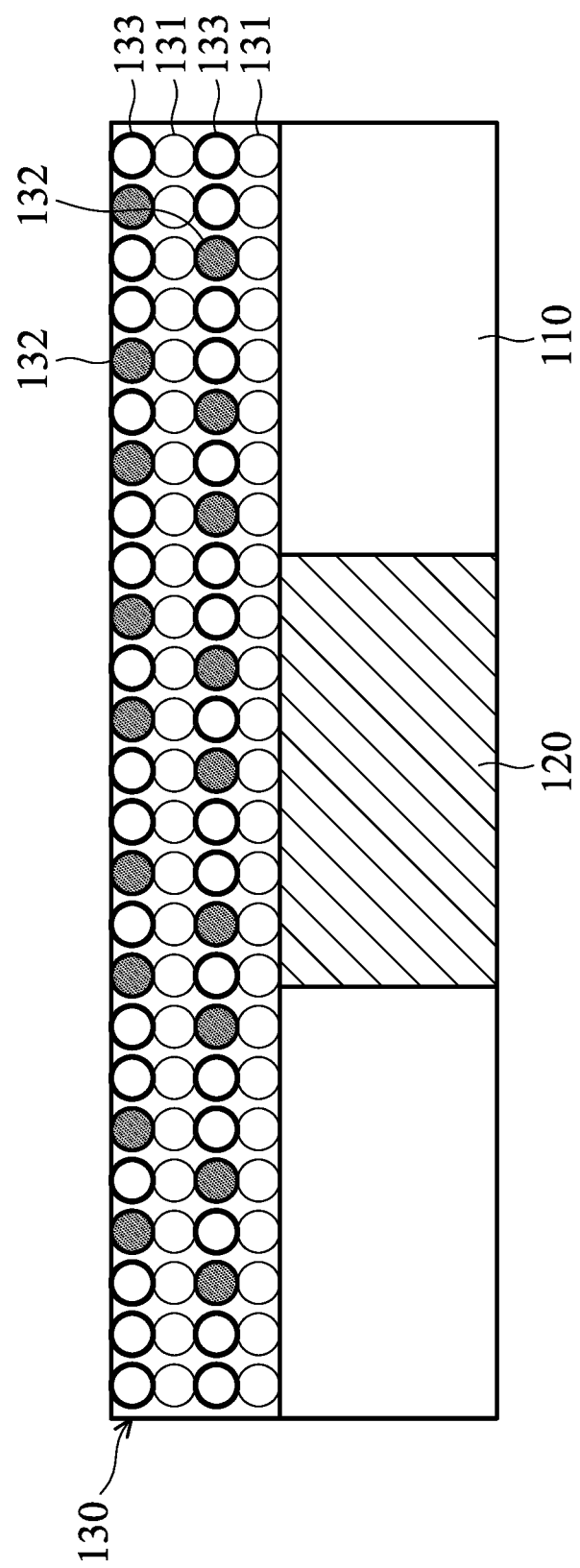

As shown in FIG. 2B, a subsequent deposition process is performed in the reaction chamber to introduce a precursor 210 over the dielectric layer 110 and the conductive feature 120. The layer of atoms 131 is exposed to a pulse of the precursor 210 and reacts with the precursor 210. Some atoms and/or molecules of the precursor 210 may be chemically bonded to the layer of atoms 131. As a result, a layer (or monolayer) of atoms 133 is deposited on the layer of atoms 131, as shown in FIG. 2B in accordance with some embodiments.

The precursor 210 may be referred to as a reactant precursor. The precursor 210 may be a gaseous precursor. In some embodiments, the precursor 210 is an N-containing precursor, or another suitable precursor. Accordingly, the atoms 133 are or include N atoms. As a result, the layer of atoms 133 and the layer of atoms 131 form aluminum nitride compound. Examples of the precursor 210 may include ammonia ($NH_3$), hydrazine ($N_2H_4$), another suitable N-containing material, and combinations thereof. In some embodiments, the precursor 210 is input or flowed into the reaction chamber using a carrier gas. The carrier gas may be an inert gas or another suitable gas.

In some embodiments, the atoms 132 are removed during the deposition process shown in FIG. 2B. The atoms 133 are substituted for the atoms 132. For example, as mentioned above, the atoms 131 may be Al atoms of Al—$(CH_3)$*, and the atoms 132 may be C atoms of Al—$(CH_3)$*. The molecules of the N-containing precursor 210 react with Al—$(CH_3)$* to form aluminum nitride compound. Accordingly, the methyl groups of Al—$(CH_3)$* are removed.

In some embodiments, the operation temperature during the deposition process shown in FIG. 2B is in a range from about 300° C. to about 400° C. In some embodiments, the operation pressure during the deposition process shown in FIG. 2B is in a range from about 2 Torr to about 6 Torr. In some embodiments, the operation time of the deposition process shown in FIG. 2B is in a range from about 2 seconds to about 6 seconds. However, embodiments of the disclosure are not limited to these ranges.

After the flow of the precursor 210 is stopped, the reaction chamber is purged. A purge gas is flowed into the reaction chamber to remove excess and unreacted precursor 210 and by-products. The purge gas may be an inert gas, such as $N_2$, or another suitable gas.

In accordance with some embodiments, some atoms 132 are left on the layer of atoms 131 after the deposition process shown in FIG. 2B and the flow of the purge gas. For example, the chemical reaction between the precursor 210 and Al—$(CH_3)$* from the precursor 200 may be incomplete. As a result, there are C atoms 132 remaining on the dielectric layer 110 and the conductive feature 120. The atoms 132 may be mixed with the atoms 133.

Afterwards, a deposition cycle including a described sequence of operations in FIGS. 2A and 2B is repeated one or more times to grown the etch stop layer 130 of a desired thickness, as shown in FIG. 2C. For example, the steps described in FIG. 2A are performed over the structure shown in FIG. 2B. The structure shown in FIG. 2B is exposed to the precursor 200 and reacts with the precursor 200. As a result, another layer of atoms 131 is deposited on the layer of atoms 133. Subsequently, the steps described in FIG. 2B are performed to deposit another layer of atoms 133. For the purpose of simplicity and clarity, FIG. 2C shows that the deposition cycle including operations shown in FIGS. 2A and 2B is repeated one time. However, embodiments of the disclosure are not limited thereto. In some other embodiments, the deposition cycle is repeated two or more times.

After multiple deposition cycles, multiple layers of atoms 131 and multiple layers of atoms 133 are alternately deposited over the dielectric layer 110 and the conductive feature 120. As a result, the layers of atoms 131 and the layers of atoms 133 together form the etch stop layer 130, as shown in FIG. 2C. In some embodiments, the thickness of the etch stop layer 130 is in a range from about 10 Å to about 50 Å.

As mentioned, some atoms 132 from the precursor 200 may be left after each deposition cycle. As a result, the etch stop layer 130 includes the atoms 131 and the atoms 132 from the precursor 200 and the atoms 133 from the precursor 210, as shown in FIG. 2C in accordance with some embodiments. In some embodiments, the remaining atoms 132 are detected by spectroscopy. The spectroscopy may be X-ray photoelectron spectroscopy (XPS), secondary ion mass spectroscopy (SIMS), or another suitable type of spectroscopy.

In some embodiments, the etch stop layer 130 has an atomic percentage (at. %) of the atoms 132 to the atoms 131, 132 and 133 that is greater than about 1%. For example, the etch stop layer 130 may have a concentration of atoms 132 that is about 1.3 at. % or even greater than 1.3 at. %. In some embodiments, the etch stop layer 130 has an atomic percentage of the atoms 131 to the atoms 131 and 133 that is greater than about 56%. For example, the etch stop layer 130 may have a concentration of atoms 131 that is in a range from about 57 at. % to about 58 at. % or even greater than about 58 at. %. In some embodiments, the etch stop layer 130 has a higher atomic percentage of the atoms 131 to the atoms 131 and 133 than an atomic percentage of the atoms 133 to the atoms 131 and 133. In some embodiments, the atomic percentage or concentration is measured by spectroscopy, such as XPS or SIMS.

Figure 2D:
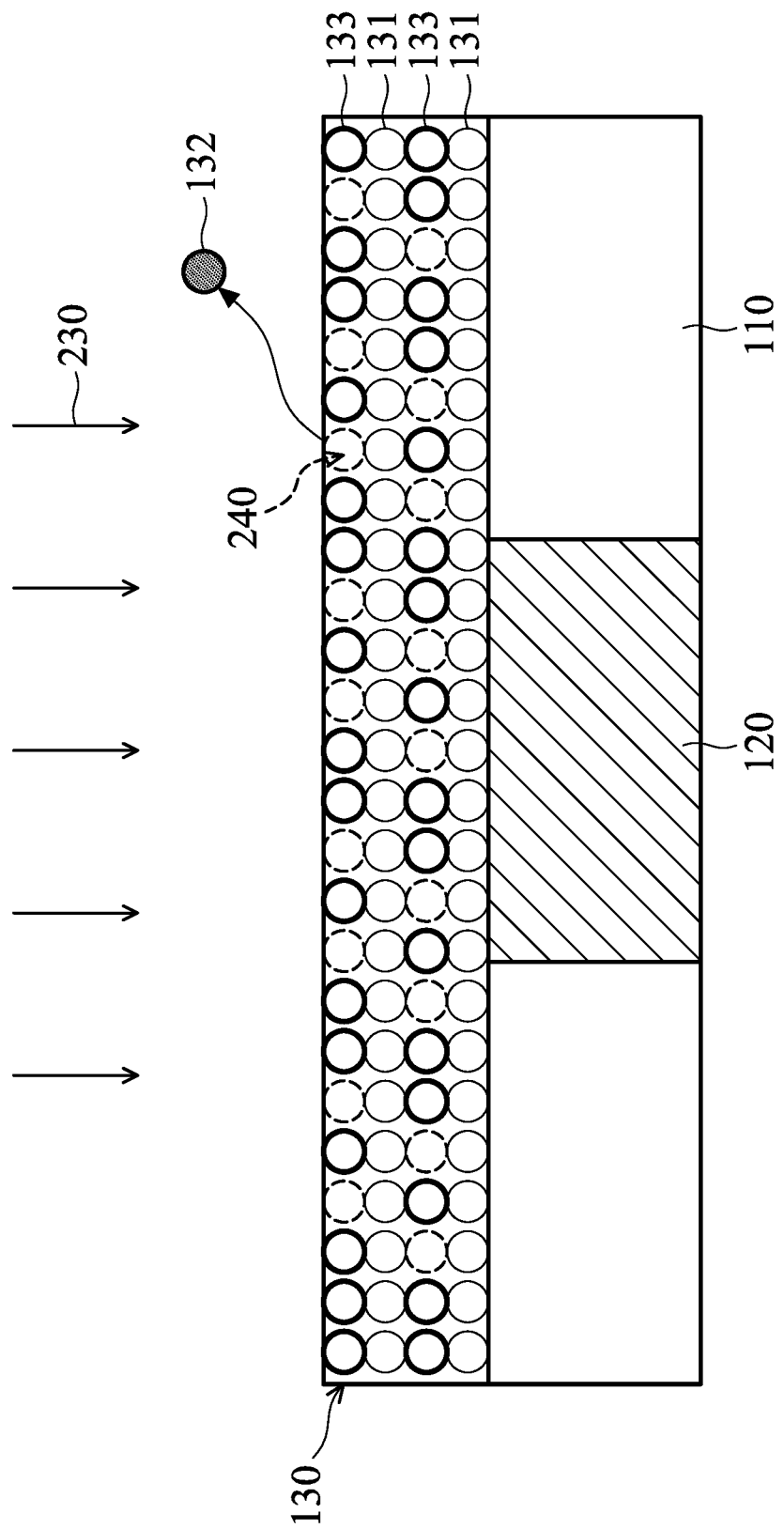

Afterwards, the etch stop layer 130 is treated with a reactant 230, as shown in FIG. 2D in accordance with some embodiments. As a result, the remaining atoms 132 in the etch stop layer 130 is removed or scavenged by the reactant 230. In some embodiments, the reactant 230 is introduced over the structure shown in FIG. 2C in the same reaction chamber where the deposition cycles are performed.

However, embodiments of the disclosure are not limited thereto. In some embodiments, the structure shown in FIG. 2C is transferred to an additional reaction chamber, and the etch stop layer 130 is treated with the reactant 230 in the additional reaction chamber. Accordingly, the operation time for forming the etch stop layer 130 shown in FIG. 2D is reduced. The production efficiency is improved and the fabrication cost is lowered.

In some embodiments, the etch stop layer 130 have a lowered atomic percentage of the atoms 132 to the atoms 131, 132 and 133 that is in a range from about 0% to about 1%. For example, the etch stop layer 130 may have a concentration of atoms 132 that is about 0.5 at. % or about 0.6 at. %. The etch stop layer 130 may be described as being substantially free of the atoms 132 (such as C atoms) after the treatment shown in FIG. 2D. In some embodiments, current leakage, which is induced by C atoms in the etch stop layer 130, is reduced or eliminated since C atoms are substantially scavenged from the etch stop layer 130.

Figure 2E:
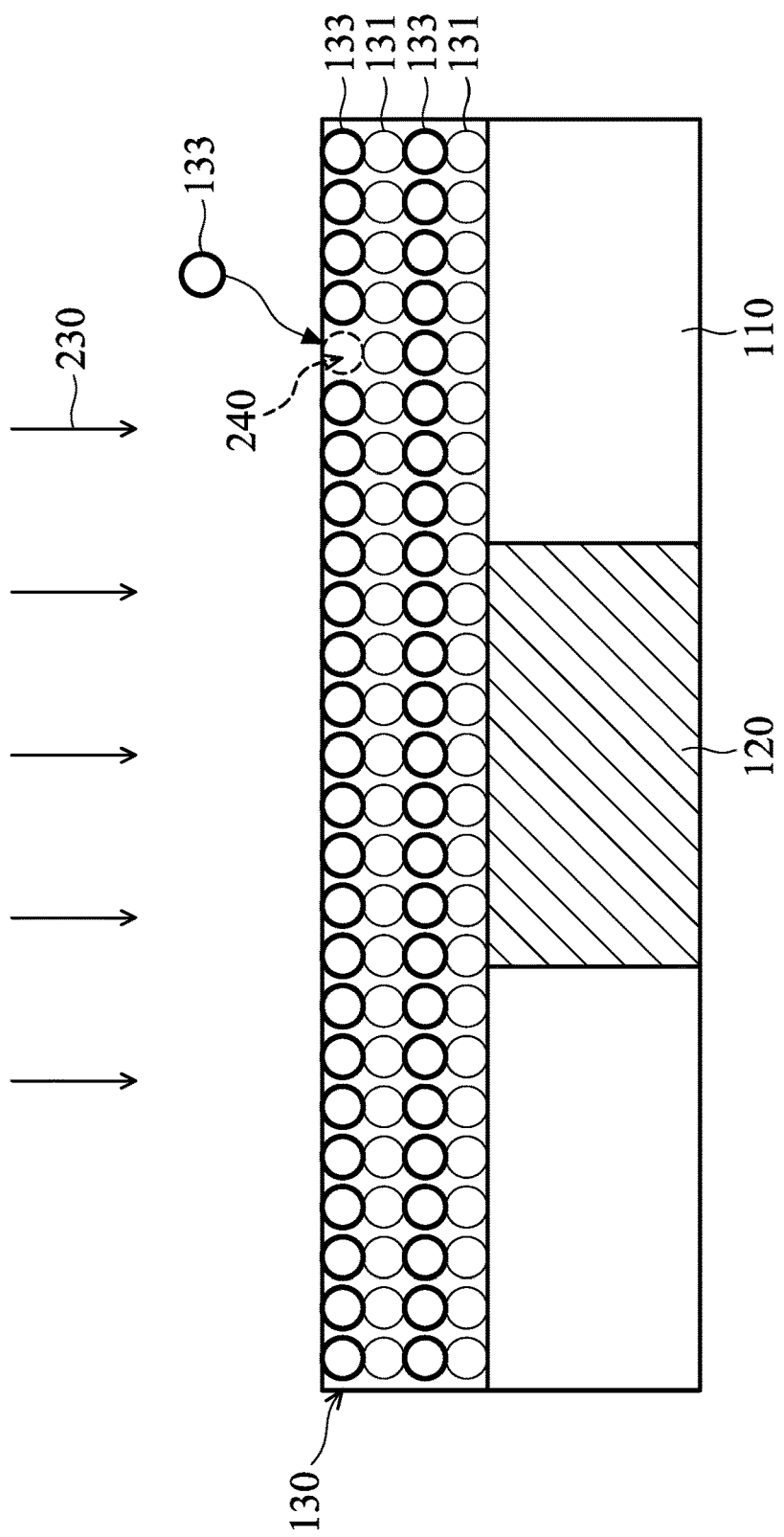

In some embodiments, multiple vacancies (or holes) 240 are formed in the etch stop layer 130 due to the removal of the atoms 132, as shown in FIG. 2D. To eliminate the vacancies 240, the etch stop layer 130 is further treated with the reactant 230 or another suitable reactant, in accordance with some embodiments. The reactant 230 shown in FIG. 2D may or may not continue being supplied to perform the operation shown in FIG. 2E. The reactant 230 provides the etch stop layer 130 with additional atoms 133. As a result, the vacancies 240 are filled with the additional atoms 133, as shown in FIG. 2E. The number of the vacancies 240 is reduced. There may be fewer vacancies 240 or substantially no vacancy (or defect) in the etch stop layer 130 after the treatment shown in FIG. 2E.

In some embodiments, the treated etch stop layer 130 has a lowered atomic percentage of the atoms 131 to the atoms 131 and 133 that is not greater than about 56%. In some embodiments, the atomic percentage of the atoms 131 to the atoms 131 and 133 that is in a range from about 49% to about 56%. The conditions of the treatments shown in FIGS. 2D and 2E may be fine-tuned to control the composition of the etch stop layer 130 and meet the required atomic percentage of the atoms 131 to the atoms 131 and 133.

In some cases, the atomic percentage of the atoms 131 to the atoms 131 and 133 may not be equal to 50% due to inevitable variations. The number of atoms 131 in the etch stop layer 130 may not be perfectly equal to the number of atoms 133 in the etch stop layer 130. In some embodiments, the number of atoms 131 in the etch stop layer 130 is greater than the number of atoms 133 in the etch stop layer 130. In some embodiments, the atomic percentage of the atoms 131 to the atoms 131 and 133 is in a range from about 50.5% to about 56.0% or in a range from about 51% to about 56%. However, embodiments of the disclosure are not limited.

Many variations and/or modifications can be made to embodiments of the disclosure. In some other embodiments, the number of atoms 131 in the etch stop layer 130 is less than the number of atoms 133 in the etch stop layer 130. In some embodiments, the atomic percentage of the atoms 131 to the atoms 131 and 133 is less than about 50% and is in a range from about 46.0% to about 49.5% or in a range from about 46% to about 49%. However, embodiments of the disclosure are not limited. In some other embodiments, the number of atoms 131 in the etch stop layer 130 is substantially equal to the number of atoms 133 in the etch stop layer 130.

In some embodiments, the etch stop layer 130 has an atomic percentage of the atoms 133 to the atoms 131 and 133 that is less than about 44% before the treatments shown in FIGS. 2D and 2E. In some embodiments, the treated etch stop layer 130 has an increased atomic percentage of the atoms 133 to the atoms 131 and 133 that is in a range from about 44% to about 54%. The increased atomic percentage of the atoms 133 to the atoms 131 and 133 may be in a range from about 44.0% to about 49.5%. Alternatively, the increased atomic percentage of the atoms 133 to the atoms 131 and 133 may be in a range from about 50.5% to about 54.0%.

In some embodiments, the reactant 230 is a gaseous reactant. In some embodiments, the reactant 230 is an N-containing reactant, or another suitable reactant. Examples of the reactant 230 may include $NH_3$, another suitable N-containing material, and combinations thereof. The reactant 230 and the precursor 210 may or may not have the same material. In some embodiments, the operation temperature during the treatments shown in FIGS. 2D and 2E is in a range from about 350° C. to about 450° C. In some embodiments, the operation pressure during the treatments shown in FIGS. 2D and 2E is in a range from about 2 Torr to about 6 Torr. In some embodiments, the operation time of the treatments shown in FIGS. 2D and 2E is in a range from about 6 seconds to about 20 seconds. However, embodiments of the disclosure are not limited to these ranges.

Many variations and/or modifications can be made to embodiments of the disclosure. In some other embodiments, the reactant 230 is a plasma-containing reactant. In some embodiments, the reactant 230 is an N-containing plasma (such as plasma generated from $NH_3$), or another suitable plasma. The plasma-containing reactant 230 is different from the precursor 210 free of plasma.

In some embodiments, the operation temperature during the treatment using the plasma-containing reactant 230 (shown in FIGS. 2D and 2E) is in a range from about 350° C. to about 450° C. In some embodiments, the operation pressure during the treatment using the plasma-containing reactant 230 is in a range from about 2 Torr to about 6 Torr. In some embodiments, the operation time of the treatment using the plasma-containing reactant 230 is in a range from about 6 seconds to about 15 seconds. In some embodiments, the radio frequency (RF) power for generating the plasma-containing reactant 230 is in a range from about 200 W to about 1000 W. However, embodiments of the disclosure are not limited to these ranges. The plasma-containing reactant 230 may be generated at a high RF, a low RF, or a combination thereof. For example, the high RF is greater than about 13.6 megahertz (MHz) while the low RF is less than about 13.6 MHz.

In some embodiments, the reactant 230 includes plasma. Accordingly, it is faster for the additional atoms 133 to fill the vacancies 240. The operation time of the treatments shown in FIGS. 2D and 2E can be reduced. The plasma-containing reactant 230 improves the efficiency of the treatments shown in FIGS. 2D and 2E.

According to some embodiments of the disclosure, the atoms 132 left in the etch stop layer 130 is removed to avoid current leakage. Although the vacancies 240 are formed in the etch stop layer 130 due to the removal of the atoms 132, the etch stop layer 130 is further treated with a reactant, which provides additional atoms 133, to fill the vacancies 240. As a result, there is a low concentration of vacancies 240 or substantially no vacancy (or defect) in the etch stop layer 130.

In some embodiments, the treated etch stop layer 130 has a lower atomic percentage of the atoms 131 to the atoms 131 and 133 that is in a range from about 46% to about 56%. The etch stop layer 130 with such atomic percentage becomes able to sufficiently block the dielectric layer 150 from metal diffusion (such as Cu diffusion) of the conductive feature 120 during thermal cycles. Accordingly, metal diffusion from the conductive feature 120 to the etch stop layer 130 or through the etch stop layer 130 to the dielectric layer 150 is prevented since no diffuse path is formed due to vacancies or defects in the etch stop layer 130. Current leakage or even short circuiting, which is induced by metal diffusion from the conductive feature 120 to and/or through the etch stop layer 130, is reduced or eliminated. The etching rate of the dielectric layer 150 during the etching process for forming the opening 160 (shown in FIG. 1C) is also prevented from being reduced due to metal diffusion. Therefore, the device performance and reliability of the semiconductor device structure is significantly enhanced.

As mentioned above, in some embodiments, the etch stop layer 130 has a lower atomic percentage of the atoms 131 to the atoms 131 and 133 that is in a range from about 46% to about 56%. In some cases, the atomic percentage of the atoms 131 to the atoms 131 and 133 should not be greater than about 56%. If the atomic percentage of the atoms 131 to the atoms 131 and 133 is greater than about 56%, there may be a few vacancies 240 left in the etch stop layer 130. These vacancies 240 may form empty and hollow paths in the etch stop layer 130. The metal material (such as Cu) of the conductive feature 120 may move and diffuse through the paths in the etch stop layer 130 to the dielectric layer 150. As a result, such metal diffusion may induce current leakage or even short circuiting and may lower the etching rate of the dielectric layer 150.

Furthermore, if the atomic percentage of the atoms 131 to the atoms 131 and 133 is greater than about 56%, the etch stop layer 130 may be under unstable state. More specifically, the bonding strength between the atoms 131 and 133 may be weak since there are fewer atoms 133. The atoms 131 may be moveable and diffuse to other layers. As a result, more empty and hollow paths are formed in the etch stop layer 130 such that it becomes easier for the metal material of the conductive feature 120 to diffuse. However, embodiments of the disclosure are not limited thereto. In some other cases, the atomic percentage of the atoms 131 to the atoms 131 and 133 may be greater than about 56%.

In some cases, the atomic percentage of the atoms 131 to the atoms 131 and 133 should not be less than about 46%. If the atomic percentage of the atoms 131 to the atoms 131 and 133 is less than about 46%, the dielectric constant (K) of the etch stop layer 130 may be increased in a way that is not desired. As a result, the RC delay time is increased. The power consumption and operation time is increased. However, embodiments of the disclosure are not limited thereto. In some other cases, the atomic percentage of the atoms 131 to the atoms 131 and 133 may be less than about 46%.

In some embodiments, the formation method shown in FIGS. 1A-1E and 2A-2E is used to form an etch stop layer in an interconnection structure of a semiconductor device. However, embodiments of the disclosure are not limited. In some other embodiments, the formation method described in the disclosure can be used to form an etch stop layer or an aluminum nitride layer in any suitable structure of a semiconductor device.

Embodiments of the disclosure can be applied to not only a semiconductor device structure with planar FETs but also a semiconductor device structure with FinFETs. In some embodiments, the materials and/or formation methods of a semiconductor device structure with FinFETs are similar to those of the described semiconductor device structure. Embodiments of the disclosure are not limited and may be applied to fabrication processes for any suitable technology generation.

Embodiments of the disclosure provide a formation method of a semiconductor device structure. The semiconductor device structure includes an etch stop layer used to assist the formation of a conductive features of an interconnection structure. The etch stop layer may include aluminum nitride. The formation of the etch stop layer includes sequentially depositing a layer of Al atoms and a layer of N atoms on the layer of Al atoms. In some cases, there are additional atoms (such as C atoms) left in the etch stop layer. To avoid current leakage induced by C atoms, the etch stop layer is treated to remove C atoms. Although vacancies may be formed in the etch stop layer due to the removal of C atoms, the etch stop layer is further treated for a sufficient time to ensure that the vacancies are eliminated. During the treatment, more N atoms are added in the etch stop layer to fill the vacancies. The etch stop layer is controlled to have a lower atomic percentage of Al to Al and N. For example, the atomic percentage of Al to Al and N is not greater than about 56%. As a result, the etch stop layer can sufficiently avoid metal diffusion (such as Cu diffusion) in the interconnection structure during thermal cycles. Current leakage or even short circuiting, which is induced by metal diffusion, is reduced or eliminated. Therefore, the semiconductor device structure has enhanced device performance and reliability.

In accordance with some embodiments, a method for forming a semiconductor device structure is provided. The method includes forming a first dielectric layer over a semiconductor substrate. The method also includes forming a first conductive feature in the first dielectric layer. The method further includes depositing a first layer including Al atoms to cover the first dielectric layer and the first conductive feature. In addition, the method includes depositing a second layer including N atoms over the first layer such that the first layer and the second layer form an etch stop layer including aluminum nitride. The etch stop layer includes vacancies and has an atomic percentage of Al to Al and N. The method also includes filling the vacancies in the etch stop layer with additional N atoms to reduce the atomic percentage of Al to Al and N. The method further includes forming a second dielectric layer over the etch stop layer. Furthermore, the method includes forming a second conductive feature in the second dielectric layer and the etch stop layer to be connected to the first conductive feature.

In accordance with some embodiments, a method for forming a semiconductor device structure is provided. The method includes forming a conductive feature in a dielectric layer. The method also includes performing multiple deposition cycles to form an aluminum nitride layer covering the conductive feature and the dielectric layer. Each of the deposition cycles includes introducing an Al-containing precursor over the conductive feature and the dielectric layer to deposit a layer of Al atoms, and introducing an N-containing precursor over the layer of Al atoms to deposit a layer of N atoms. The aluminum nitride layer has an atomic percentage of N to Al and N. The method further includes introducing an N-containing reactant over the aluminum nitride layer to increase the atomic percentage of N to Al and N after the deposition cycles.

In accordance with some embodiments, a semiconductor device structure is provided. The semiconductor device structure includes an interconnection structure over a semiconductor substrate. The interconnection structure includes a first metal feature in a first dielectric layer. The interconnection structure also includes an aluminum nitride layer covering the first dielectric layer and the first metal feature. The aluminum nitride layer has an atomic percentage of Al to Al and N. The atomic percentage of Al to Al and N is in a range from about 46% to about 56%. The interconnection structure further includes a second dielectric layer over the aluminum nitride layer. In addition, the interconnection structure includes a second metal feature in the second dielectric layer and the aluminum nitride layer and connected to the first metal feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first dielectric layer over a semiconductor substrate;
    forming a first conductive feature in the first dielectric layer;
    depositing a first layer comprising aluminum (Al) atoms to cover the first dielectric layer and the first conductive feature;
    depositing a second layer comprising nitrogen (N) atoms by introducing a gas containing N atoms over the first layer such that the first layer and the second layer form an etch stop layer comprising aluminum nitride, wherein the etch stop layer comprises vacancies and has an atomic percentage of Al to Al and N;

filling the vacancies in the etch stop layer with a plasma containing additional N atoms to reduce the atomic percentage of Al to Al and N;

forming a second dielectric layer over the etch stop layer; and forming a second conductive feature in the second dielectric layer and the etch stop layer to be connected to the first conductive feature.

2. The method for forming a semiconductor device structure as claimed in claim 1, wherein the atomic percentage of Al to Al and N is reduced to be in a range from about 46% to about 56%.

3. The method for forming a semiconductor device structure as claimed in claim 1, wherein the etch stop layer comprises carbon (C) atoms and has an atomic percentage of C to C, Al and N, and wherein the method for forming the semiconductor device structure further comprises:

removing the C atoms to form the vacancies and reduce the atomic percentage of C to C, Al and N before the Al atomic percentage is reduced.

4. The method for forming a semiconductor device structure as claimed in claim 3, wherein the atomic percentage of C to C, Al and N is reduced by exposing the etch stop layer to an N-containing gas or plasma.

5. The method for forming a semiconductor device structure as claimed in claim 3, wherein the C atoms are mixed with the second layer without being mixed with the first layer, and the vacancies are formed in the second layer.

6. The method for forming a semiconductor device structure as claimed in claim 1, wherein the etch stop layer is formed using an atomic layer deposition (ALD) process comprising a plurality of deposition cycles, and each of the plurality of deposition cycles comprises the deposition of the first layer and the deposition of the second layer, and wherein the filling of the vacancies is performed after the plurality of deposition cycles.

7. The method for forming a semiconductor device structure as claimed in claim 1, further comprising:

forming a protection layer covering the etch stop layer after the filling of the vacancies and before the formation of the second dielectric layer, wherein the second conductive feature penetrates through the protection layer.

8. The method for forming a semiconductor device structure as claimed in claim 1, further comprising:

cleaning the first conductive feature before depositing the first layer.

9. The method for forming a semiconductor device structure as claimed in claim 1, wherein the first layer and the second layer are deposited in a first chamber, the vacancies in the etch stop layer are filled with the additional N atoms in a second chamber, and the second chamber is different from the first chamber.

10. The method for forming a semiconductor device structure as claimed in claim 1, wherein the deposition of the second layer is performed in a first operation time, and the filling of the additional N atoms is performed in a second operation time, and wherein the second operation time is longer than the first operation time.

11. A method for forming a semiconductor device structure, comprising:

forming a first conductive feature in a first dielectric layer;

performing a plurality of deposition cycles to form an aluminum nitride layer covering the first conductive feature and the first dielectric layer, wherein each of the plurality of deposition cycles comprises:

introducing an Al-containing precursor over the first conductive feature and the first dielectric layer to deposit a layer of Al atoms; and introducing an N-containing precursor over the layer of Al atoms to deposit a layer of N atoms for a first operation time, wherein the aluminum nitride layer has an atomic percentage of N to Al and N;

introducing an N-containing reactant over the aluminum nitride layer for a second operation time to increase the atomic percentage of N to Al and N after the plurality of deposition cycles, wherein the second operation time is different from the first operation time.

12. The method for forming a semiconductor device structure as claimed in claim 11, wherein the Al-containing precursor provides the aluminum nitride layer with C atoms, and the C atoms are removed from the aluminum nitride layer during the introduction of the N-containing reactant.

13. The method for forming a semiconductor device structure as claimed in claim 11, wherein the aluminum nitride layer comprises vacancies in the layer of N atoms, and a number of the vacancies is reduced during the introduction of the N-containing reactant.

14. The method for forming a semiconductor device structure as claimed in claim 11, wherein the N-containing precursor and the N-containing reactant comprises $NH_3$ gas.

15. The method for forming a semiconductor device structure as claimed in claim 11, wherein the N-containing precursor comprises a gas and the N-containing reactant comprises a plasma reactant.

16. The method for forming a semiconductor device structure as claimed in claim 11, wherein the second operation time is longer than the first operation time.

17. The method for forming a semiconductor device structure as claimed in claim 11, wherein the atomic percentage of N to Al and N is increased to be in a range from about 44% to about 54%.

18. The method for forming a semiconductor device structure as claimed in claim 11, wherein the aluminum nitride layer has an atomic percentage of Al to Al and N after the introduction of the N-containing reactant, and wherein the atomic percentage of Al to Al and N is greater or less than the atomic percentage of N to Al and N.

19. The method for forming a semiconductor device structure as claimed in claim 11, further comprising:

forming a second dielectric layer over the aluminum nitride layer after the atomic percentage of N to Al and N is increased;

partially etching the second dielectric layer until a portion of the aluminum nitride layer is exposed to form an opening in the second dielectric layer;

removing the portion of the aluminum nitride layer to expose the first conductive feature; and forming a second conductive feature in the opening to be connected to the first conductive feature.

20. A method for forming a semiconductor device structure, comprising:

forming a first conductive feature in a first dielectric layer;

depositing a first layer to cover the first dielectric layer and the first conductive feature, wherein the first layer comprises aluminum (Al) atoms and carbon (C) atoms;

depositing a nitrogen layer over the first layer to form an etch stop layer made of aluminum nitride in a first chamber, wherein the C atoms in the first layer are partially replaced by nitrogen (N) atoms in the nitrogen layer;

introducing a reactant to the etch stop layer to form vacancies in the etch stop layer in a second chamber; and filling the vacancies in the etch stop layer with additional N atoms, wherein the second chamber is different from the first chamber.

\* \* \* \* \*